(12) United States Patent
Giuliano

(10) Patent No.: US 9,497,854 B2
(45) Date of Patent: Nov. 15, 2016

(54) MULTI-LAYER POWER CONVERTER WITH DEVICES HAVING REDUCED LATERAL CURRENT

(71) Applicant: Arctic Sand Technologies, Inc., Cambridge, MA (US)

(72) Inventor: David Giuliano, Brookline, MA (US)

(73) Assignee: ARCTIC SAND TECHNOLOGIES, INC., Burlington, MA (US)

( * ) Notice: Subject to any disclaimer, the term of this patent is extended or adjusted under 35 U.S.C. 154(b) by 0 days.

(21) Appl. No.: 14/294,642

(22) Filed: Jun. 3, 2014

(65) Prior Publication Data

US 2014/0301057 A1    Oct. 9, 2014

Related U.S. Application Data

(62) Division of application No. 13/654,113, filed on Oct. 17, 2012, now Pat. No. 8,743,553.

(60) Provisional application No. 61/548,360, filed on Oct. 18, 2011.

(51) Int. Cl.
| | |
|---|---|
| H05K 1/02 | (2006.01) |
| H02M 3/07 | (2006.01) |
| H01L 23/64 | (2006.01) |
| H01L 25/16 | (2006.01) |
| H01L 27/01 | (2006.01) |
| H01L 27/06 | (2006.01) |
| H01L 49/02 | (2006.01) |
| H01L 23/48 | (2006.01) |

(Continued)

(52) U.S. Cl.
CPC ............ *H05K 1/0298* (2013.01); *H01L 23/481* (2013.01); *H01L 23/5223* (2013.01); *H01L 23/64* (2013.01); *H01L 23/642* (2013.01); *H01L 25/16* (2013.01); *H01L 27/016* (2013.01); *H01L 27/0688* (2013.01); *H01L 28/40* (2013.01); *H01L 28/90* (2013.01); *H02M 3/07* (2013.01); *H05K 1/115* (2013.01); *H01L 23/5227* (2013.01); *H01L 2224/0401* (2013.01); *H01L 2224/0557* (2013.01); *H01L 2224/05572* (2013.01); *H01L 2224/16225* (2013.01); *H01L 2224/16265* (2013.01); *H01L 2924/19103* (2013.01); *H01L 2924/19104* (2013.01); *H02M 2003/077* (2013.01)

(58) Field of Classification Search
None
See application file for complete search history.

(56) References Cited

U.S. PATENT DOCUMENTS

| | | | |
|---|---|---|---|
| 4,214,174 | A | 7/1980 | Dickson |
| 5,301,097 | A | 4/1994 | McDaniel |

(Continued)

FOREIGN PATENT DOCUMENTS

| | | |
|---|---|---|
| JP | 10327573 | 12/1998 |
| JP | 11235053 | 8/1999 |

(Continued)

*Primary Examiner* — John P Dulka
(74) *Attorney, Agent, or Firm* — Occhiuti & Rohlicek LLP

(57) ABSTRACT

An apparatus having a power converter circuit having a first active layer having a first set of active devices disposed on a face thereof, a first passive layer having first set of passive devices disposed on a face thereof, and interconnection to enable the active devices disposed on the face of the first active layer to be interconnected with the non-active devices disposed on the face of the first passive layer, wherein the face on which the first set of active devices on the first active layer is disposed faces the face on which the first set of passive devices on the first passive layer is disposed.

33 Claims, 17 Drawing Sheets

(51) Int. Cl.
    *H01L 23/522*    (2006.01)
    *H05K 1/11*      (2006.01)

(56)           References Cited

U.S. PATENT DOCUMENTS 5,737,201  A     4/1998  Meynard et al.
    7,190,210  B2    3/2007  Azrai et al.
    7,224,062  B2    5/2007  Hsu
    7,239,194  B2    7/2007  Azrai et al.
    7,807,499  B2 *  10/2010 Nishizawa ............... 438/107
    8,048,766  B2    11/2011 Joly et al.
    8,193,604  B2    6/2012  Lin et al.
    8,212,541  B2    7/2012  Perrault et al.
    8,395,914  B2    3/2013  Klootwijk et al.
    2002/0060914 A1* 5/2002  Porter et al. ............ 363/21.01
    2005/0207133 A1* 9/2005  Pavier et al. ................ 361/761
    2007/0230221 A1* 10/2007 Lim et al. ....................... 363/16
    2009/0257211 A1  10/2009 Kontani et al.
    2010/0140736 A1  6/2010  Lin et al.
    2010/0202161 A1  8/2010  Sims et al.
    2010/0214746 A1  8/2010  Lotfi et al.
    2010/0244189 A1  9/2010  Klootwijk et al.
    2010/0244585 A1  9/2010  Tan et al.
    2011/0163414 A1  7/2011  Lin et al.
    2012/0146177 A1  6/2012  Choi et al.
    2013/0049714 A1  2/2013  Chiu

FOREIGN PATENT DOCUMENTS

WO       2006/093600       9/2006
    WO       2012/151466       11/2012

* cited by examiner

MULTI-LAYER POWER CONVERTER WITH DEVICES HAVING REDUCED LATERAL CURRENT

RELATED APPLICATIONS

This application is a divisional of U.S. application Ser. No. 13/654,113, filed on Oct. 17, 2012, which claims the benefit of the priority date of U.S. Provisional Application No. 61/548,360, filed on Oct. 18, 2011, the contents of which are herein incorporated by reference.

FIELD OF DISCLOSURE

The present invention relates to energy storage elements in power converters that use capacitors to transfer energy.

BACKGROUND

Power converters generally include switches and one or more capacitors, for example, to power portable electronic devices and consumer electronics. A switch-mode power converter is a specific type of power converter that regulates its output voltage or current by switching storage elements (i.e. inductors and capacitors) into different electrical configurations using a switch network.

One type of switch-mode power converter is the switched capacitor converter. A switched capacitor converter uses capacitors to transfer energy. As the transformation ratio increases, the number of capacitors and switches increases.

A switch capacitor converter includes a switch network containing numerous switches. These switches are active devices that are usually implemented with transistors. The switch network can be integrated on a single or on multiple monolithic semiconductor substrates.

Typical power converters perform voltage transformation and output regulation. In many power converters, such as a buck converter, this is carried out in a single stage. However, it is also possible to split these two functions into two specialized stages. Such two-stage power converter architectures feature a transformation stage and a separate regulation stage. The transformation stage transforms one voltage into another, while the regulation stage ensures that the voltage and/or current output of the transformation stage maintains desired characteristics.

An example of a two-stage power converter architecture is illustrated in FIG. 1A, where capacitors are utilized to transfer energy. The transformation stage is represented by a switched-capacitor element 12A, which closely resembles a switched capacitor converter while the regulation stage is represented by a regulating circuit 16A.

In this architecture, a switched capacitor element 12A is electrically connected to a voltage source 14 at an input end thereof. An input of a regulating circuit 16A is electrically connected to an output of the switched capacitor element 12A. A load 18A is then electrically connected to an output of the regulating circuit 16A. Such a converter is described in US Patent Publication 2009/0278520, filed on May 8, 2009, the contents of which are herein incorporated by reference. Furthermore, a modular multi-stage power converter architecture was described in PCT Application PCT/2012/36455, filed on May 4, 2012, the contents of which are also incorporated herein by reference.

The switched capacitor element 12A and regulating circuit 16A can be mixed and matched in a variety of different ways. This provides a transformative integrated power solution (TIPS™) for the assembly of such converters. As such, the configuration shown in FIG. 1A represents only one of multiple ways to configure one or more switched capacitor elements 12 with one or more regulating circuits 16A.

Typically, the switch network of the switched capacitor element 12A and the regulating circuit 16A are fabricated in a semiconductor process that has passive devices. However, these passive devices are normally used in the analog circuitry to control the power converter. They are not normally used to store energy in the power converter. This is because these passive devices cannot efficiently store a significant amount of energy.

These passive devices are usually planar and fabricated after the active devices in a higher level of metal to reduce parasitic effects. Since these passive devices are fabricated after the active devices, and on the same wafer as the active devices, the processing steps for making these passive devices should be chosen carefully. An incorrect choice may damage the active devices that have already been fabricated.

To avoid possibly damaging the active devices during fabrication of the passive devices, it is preferable to only use CMOS compatible processing. Given this processing requirement, it is difficult and/or expensive to achieve high capacitance density capacitors or high Q inductors in a CMOS flow. Therefore, in power converters, it is common practice to store energy in discrete components, such as multilayer ceramic capacitors and chip inductors. However, it is possible to produce inexpensive high performance passive devices in their own wafer and process flow that can be used in specific applications. These devices will be referred to as integrated passive devices (IPDs).

An implementation of the power converter architecture shown in FIG. 1A is illustrated in FIG. 1B-1D.

In the embodiment shown in FIG. 1B, a power converter 20 draws energy from a voltage source 14 at a high input voltage VIN and delivers that energy to a load 18A at a low output voltage VO. Without loss of generality, the load 18A is modeled as a resistor.

The power converter 20 includes a switched capacitor element 12A that features a 3:1 series-parallel switched capacitor network having power switches S1-S7 and pump capacitors C21-C22. In contrast, the regulating circuit 16A is a buck converter having first and second output power switches SL, SH, a filter inductor L1, and an output capacitor CO. The power switches S1-S7, the output power switches SL, SH, and the driver/control circuitry 23 are integrated in a single semiconductor die 22. However, the pump capacitors C21-C22, the filter inductor L1, and a decoupling input capacitor CIN1 are discrete components.

In operation, the power switches S1, S3, S6 and the power switches S2, S4, S5, S7 are always in complementary states. Thus, in a first switch state, the power switches S1, S3, S6 are open and the power switches S2, S4, S5, S7 are closed. In a second switch state, the power switches S1, S3, S6 are closed and the power switches S2, S4, S5, S7 are open. Similarly, the output power switches SL, SH are in complementary states.

Typically, the regulating circuit 16A operates at higher switching frequencies than the switched capacitor element 12A. However, there is no requirement of any particular relationship between the switching frequencies of the regulating circuit 16A and the switching frequency of the switched capacitor element 12A. The driver/control circuitry 23 provides the necessary power to activate the switches and controls the proper switch states to ensure a regulated output voltage VO.

In power converters, it is common practice to solder a semiconductor die 22 or packaged die to an electrical interface 28, and to then horizontally mount capacitors and inductors on the electrical interface 28 around the semiconductor die 22. Such an arrangement is shown in a top view in FIG. 1D and in a side view in FIG. 1C taken along a line 24 in FIG. 1D.

An electrical interface 28 provides electrical conductivity between the power converter 20 and a load to which the power converter 20 is ultimately supplying power. Examples of electrical interfaces 28 include printed circuit boards, package lead frames, and high density laminates.

The discrete components in the power converter 20 include the pump capacitors C21-C22, the input capacitor CIN1, the output capacitor CO, and the filter inductor L1. These discrete components are horizontally disposed with respect to the semiconductor die 22 and electrically coupled to the die 22 bytraces on the electrical interface 28.

Each power switch in the power converter 20 is typically composed of numerous smaller switches connected in parallel as illustrated by the close-up 26 in FIG. 1D. This allows the power switches to carry a large amount of current without overheating.

SUMMARY

In one aspect, the invention features an apparatus including a power converter circuit, the power converter circuit including a first active layer having a first set of switching devices disposed on a face thereof, a first passive layer having first set of passive devices disposed on a face thereof, and interconnection to enable the switching devices disposed on the face of the first active layer to be interconnected with the non-active devices disposed on the face of the first passive layer, wherein the face on which the first set of switching devices on the first active layer is disposed faces the face on which the first set of passive devices on the first passive layer is disposed.

In some embodiments, the face on which the first set of switching devices on the first active layer is disposed faces the face on which the first set of passive devices on the first passive layer is disposed.

In some embodiments, the interconnection to enable the switching devices disposed on the face of the first active layer to be interconnected with the passive devices disposed on the face of the first passive layer includes a thru via extending through at least one of the first active layer and the first passive layer. Among these embodiments are those in which the interconnection to enable the switching devices disposed on the face of the first active layer to be interconnected with the passive devices disposed on the face of the first passive layer further includes an interconnect structure connected to the thru via and to one of the first active layer and the first passive layer.

In other embodiments, the power converter circuit further includes one or more additional layers. Among these embodiments are those in which the one or more additional layers comprise a second passive layer containing a second set of passive devices, those in which the one or more additional layers includes a second active layer containing a second set of switching devices, and those in which the one or more additional layers comprise a second layer having a face on which a third set of devices is disposed and a third layer having a face on which a fourth set of devices is disposed, and wherein the face on which the fourth set of devices is disposed faces the face on which the third set of devices is disposed.

Also among the embodiments are those in which the first passive layer includes an energy-storage element. Among these are those in which the energy-storage element includes a capacitor. In some of these embodiments, the capacitor includes a planar capacitor, whereas in others, the capacitor includes a trench capacitor.

Some embodiments include an electrical interface, and a connection between the electrical interface and the first active layer of the circuit. Others include an electrical interface, and a connection between the electrical interface and the first non-active layer of the circuit.

In some embodiments, the power converter circuit further includes vias extending through the first active layer. Among these are embodiments in which the power converter circuit further includes vias extending through the first passive layer.

Also included among the embodiments of the invention are those in which the power converter circuit further includes additional layers, wherein the additional layers comprise a second active layer and a third active layer, the apparatus further including a thru via connected the second active layer and the third active layer.

In addition to all the foregoing embodiments, additional embodiments of the invention are those in which the power converter circuit further includes additional layers, wherein the additional layers comprise a second passive layer and a third passive layer, the power converter circuit further including a thru via providing an electrical connection between the second passive layer and the third passive layer.

The power converter circuit can implement any power converter circuit. In one embodiment, the power converter circuit implements a buck converter. In another embodiment, the power converter circuit implements a switched capacitor circuit.

In some embodiments, the first passive layer includes capacitors. Among these embodiments are those that further include an electrical interface and solder bumps connecting the power converter circuit to the electrical interface, wherein the solder bumps are disposed according to a solder bump pitch, and wherein the interconnection has an interconnection pitch, the interconnection pitch being smaller than the solder bump pitch, as well as those in which at least one of the capacitors is sized to fit at least one of above a switching device in the first active layer and below a switching device in the first active layer.

In some embodiments, the electrical interconnect includes a multilayer interconnect structure.

Other embodiments include a driver and control unit to provide power and to control the switching devices.

In some embodiments, the apparatus also includes a data processing unit and a touch-screen interface, both of which are configured to consume power provided by said switched mode power converter circuit. Among these are embodiments that also include a wireless transmitter and receiver, all of which are configured to consume power provided by said switched mode power converter circuit. Examples of such embodiments are smart phones, tablet computers, laptop computers, and other portable electronic devices.

In another aspect, the invention features an apparatus including passive layers, active layers, thru vias, and at least one interconnection layer. The interconnection layer provides electrical connection between an active layer and a passive layer. The thru vias provide electrical connection between two or more active layers, or between two or more passive layers.

In another aspect, the invention features an apparatus having a power converter circuit including a stack of layers, the stack including an active layer having active devices integrated on a device face thereof and a passive layer having passive devices integrated on a device face, thereof. Either an active device or a passive device is partitioned into at least two partitions. Each partition defines a current channel along a first axis, The partitioned component thus suppresses current flow along a second axis orthogonal to the first axis.

In some embodiments, the passive devices include a planar capacitor.

Other embodiments include a regulating circuit having a first regulating circuit partition and a second regulating circuit partition. The regulating circuit is connected to receive an output from the power converter circuit. The embodiment also includes a first inductor having a first terminal and a second terminal, the first terminal being connected to an output of the first regulating circuit partition, and the second terminal being connected to a load, a second inductor having a first terminal and a second terminal, the first terminal being connected to an output of the second regulating circuit partition, and the second terminal being connected to the second terminal of the first inductor, whereby in operation, the second terminal of the first inductor and the second terminal of the second inductor are at a common potential. Among these embodiments are those that include a load connected to the second terminal of the first inductor and the second terminal of the second inductor.

In some embodiments, the first switched capacitor unit is positioned over the first regulating circuit partition at a location that minimizes an extent to which current travels between the power converter circuit and the first regulating circuit partition.

These and other features of the invention will be apparent from the following description and the accompanying figures in which:

DETAILED DESCRIPTION

Power converters that use capacitors to transfer energy have certain disadvantages when packaged in the traditional way. Such power converters require a larger number of components and a larger number of pins than conventional topologies. For example, power converter 20 requires two additional capacitors and four additional pins when compared to a buck converter.

Furthermore, extra energy is lost due to parasitic losses in the interconnection structure between the additional capacitors and the devices in the switch network. The devices and methods described herein address these issues by vertically integrating the passive devices with the active devices within a power converter.

Embodiments described herein generally include three components: a passive device layer 41A, also referred to a "passive layer", an active device layer 42A, also referred to as an "active layer", and an interconnect structure 43B. Each layer has devices that will typically be integrated on a single monolithic substrate or on multiple monolithic substrates, both of which may also be incorporated within a reconstituted wafer as in the case of fan-out wafer scale packaging. The passive layer 41A can be fabricated by an IPD process while the active layer 42A can be fabricated by a CMOS process. Each device layer pair is electrically connected together through a high density interconnect structure, which may also include a redistribution layer or micro bumps.

Additionally, thru vias 47A can be included which allow electrical connections to additional device layers. In the case of a single monolithic substrate, the thru vias may include thru silicon vias, whereas in the case of a reconstituted wafer, the thru vias may include thru mold vias.

Figure 2A:
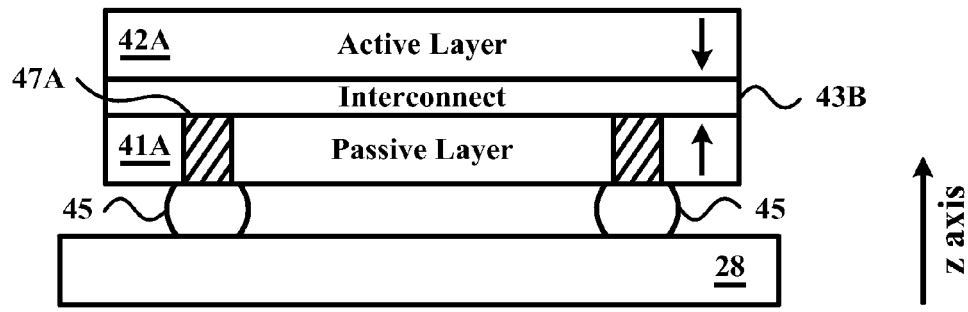
FIGS. 2A-2C are side views of various power converters with integrated capacitors.
Figure 2B:
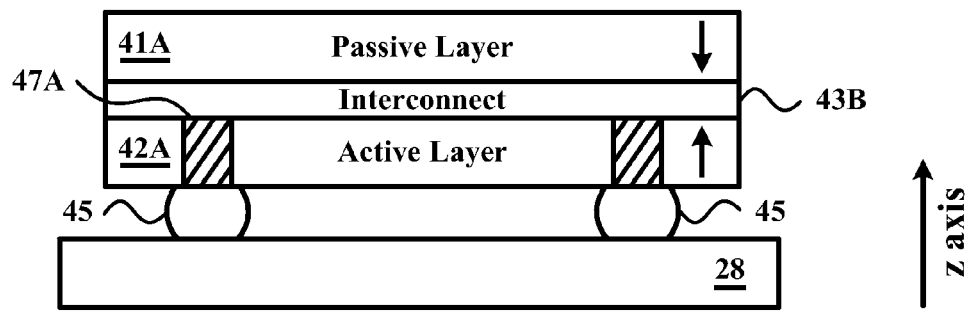
Figure 2C:
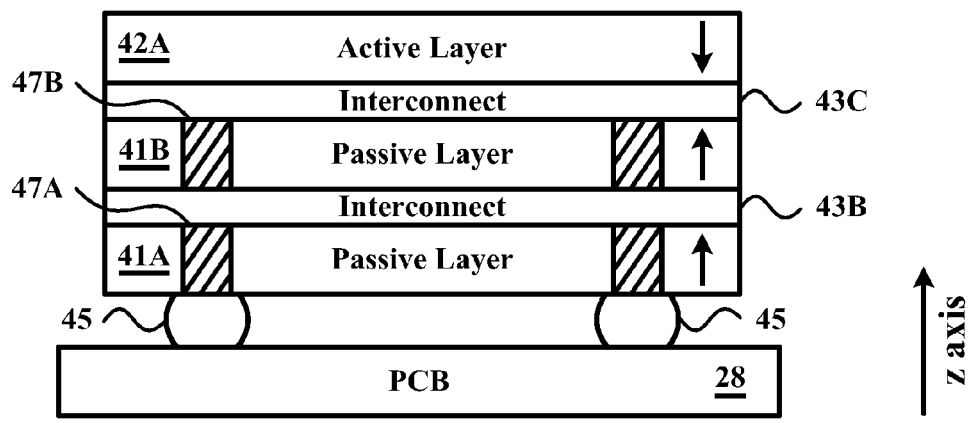

Side views of three different embodiments with thru vias 47A are illustrated in FIGS. 2A-2C. These are only a few of the possible permutations. Each side-view includes at least a passive layer 41A, an active layer 42A, thru vias 47A, and an interconnect structure 43B.

The passive layer 41A includes passive devices such as capacitors, inductors, and resistors. The active layer 42A includes active devices such as transistors and diodes. The interconnect structure 43B provides electrical connections between the passive layer 41A and the active layer 42A. Meanwhile, thru vias 47A allow for electrical connections to pass thru the passive layer 41A or thru the active layer 42A.

The interconnect structure 43B can also provide electrical connection between devices on the same layer. For example, separate active devices in different locations on the active layer 42A can be electrically connected using the interconnect structure 43B.

In the particular embodiment shown in FIG. 2A, the passive layer 41A is between the active layer 42A and the electrical interface 28. An interconnect structure 43B provides interconnections between devices on the active layer 42A and devices on the passive layer 41A. The interconnect structure 43B in some cases can also provide electrical connections between two devices that are on the same passive layer 41A or two devices on the same active layer 42A. Each device layer 41A, 42A has a device face on which the devices are actually formed. The locations of these device faces are indicated by the pair of arrows.

In the embodiment of FIG. 2A, the device face on the active layer 42A faces, or is opposed to, the device face on the passive layer 41A. Thru vias 41A cut through the passive layer and connect to the interconnect structure 43B. Thus, the path between devices on layers separated by intervening layers generally includes at least a portion through an interconnect structure 34B and a portion through a via 41A. In this way, the interconnect structure 34B provides electrical continuity between devices in different layers, whether the layers are adjacent or otherwise.

In the alternative embodiment shown in FIG. 2B, the active layer 42A is between the passive layer 41A and the electrical interface 28. Thru vias 42A in this case pass through the active layer 42A. Once again, an interconnect structure 43B connects the passive devices on the passive layer 41A, the active devices on the active layer 42A, and the thru vias 47A. Once again, as indicated by the arrows, the device face of the passive layer 41A and the device face of the active layer 42A are opposite each other.

As shown in yet another embodiment in FIG. 2C, it is also possible to use more than two device layers by stacking one or more passive layers and one or more active layers. In the particular embodiment shown in FIG. 2C, such a stack includes first and second passive layers 41A-41B capped by an active layer 42A. The embodiment further includes a first interconnect structure 43B between the first and second passive layers 41A, 41B and a second interconnect structure 43C between the second passive layer 41B and the active layer 42A. As indicated by the arrows, the device faces of the second passive layer 41B and the active layer 42A face each other, but the device faces of the first and second passive layers 41A, 41B do not.

Figure 1A:
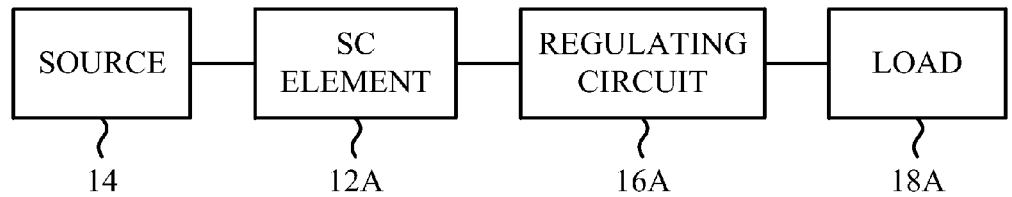
FIG. 1A is a block diagram of a known power converter architecture.
Figure 1B:
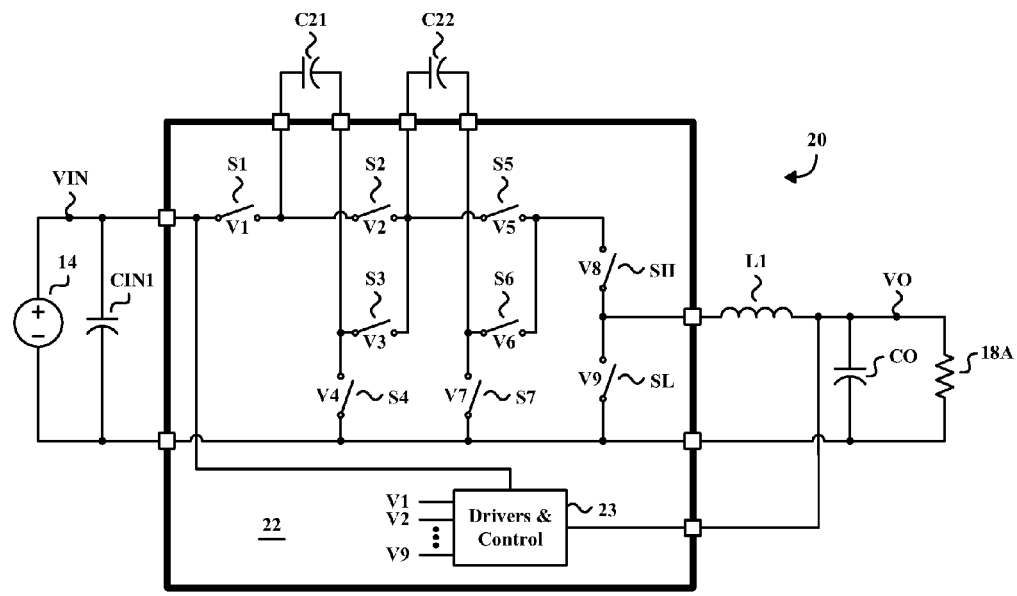
FIG. 1B is a particular implementation of the converter architecture shown in FIG. 1.

The embodiment shown in FIG. 2A-2C can be used to eliminate the pin count penalty in power converter 20 shown in FIG. 1B.

Figure 3A:
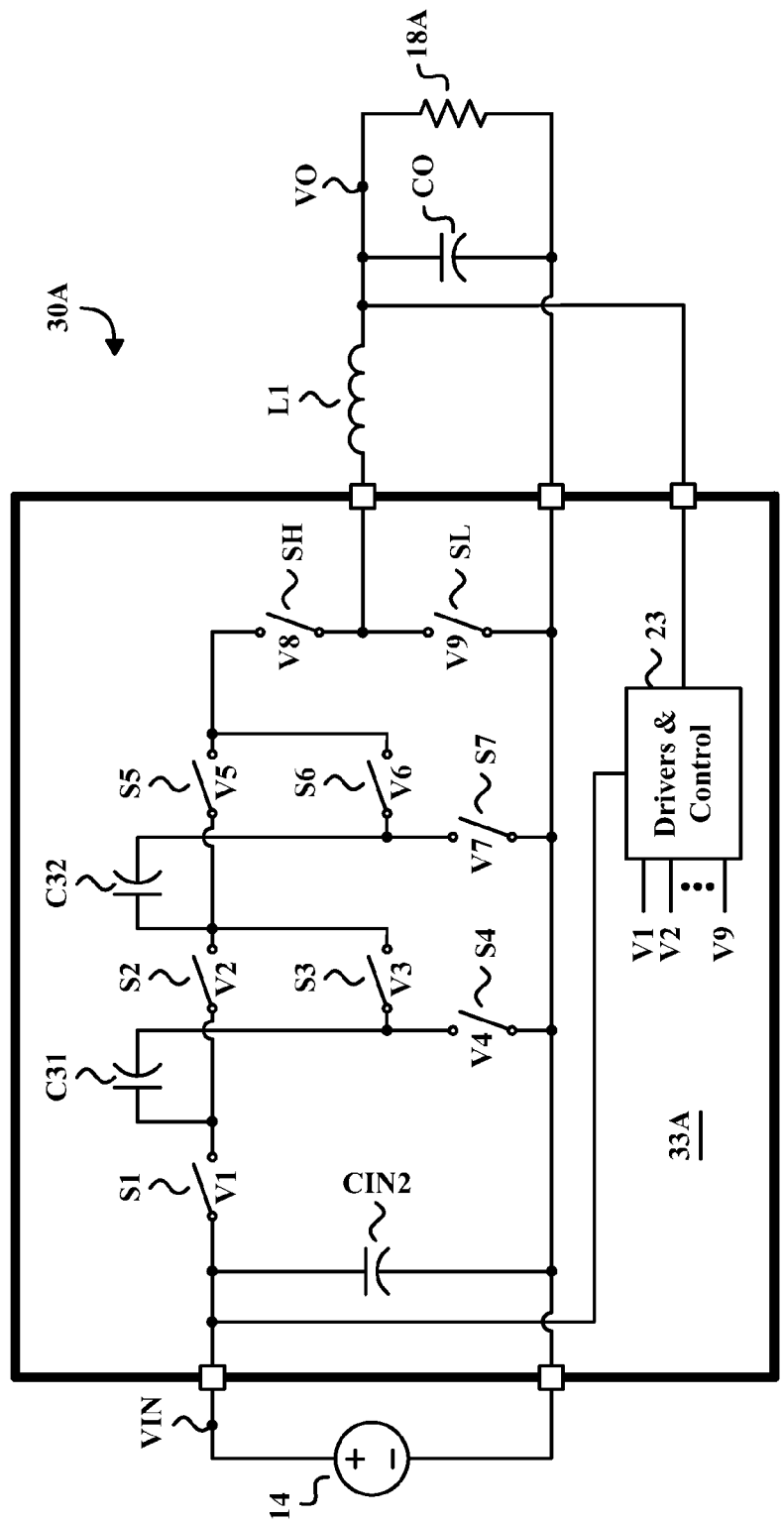
FIG. 3A is a circuit diagram of a power converter with integrated capacitors.

As illustrated in FIG. 3A, the discrete capacitors C21, C22, CIN1 in the power converter 20 are replaced by integrated capacitors C31, C32, CIN2 respectively that are all placed on a passive layer 41A (not shown). Meanwhile, the active devices S1-S7, SL-SH, and control circuit 23 are all included in a separate active layer 42A that would be stacked relative to the passive layer as suggested by FIGS. 2A-2C. The resulting power converter 30A has three fewer discrete capacitors and four fewer pins than the power converter 20.

Figure 3B:
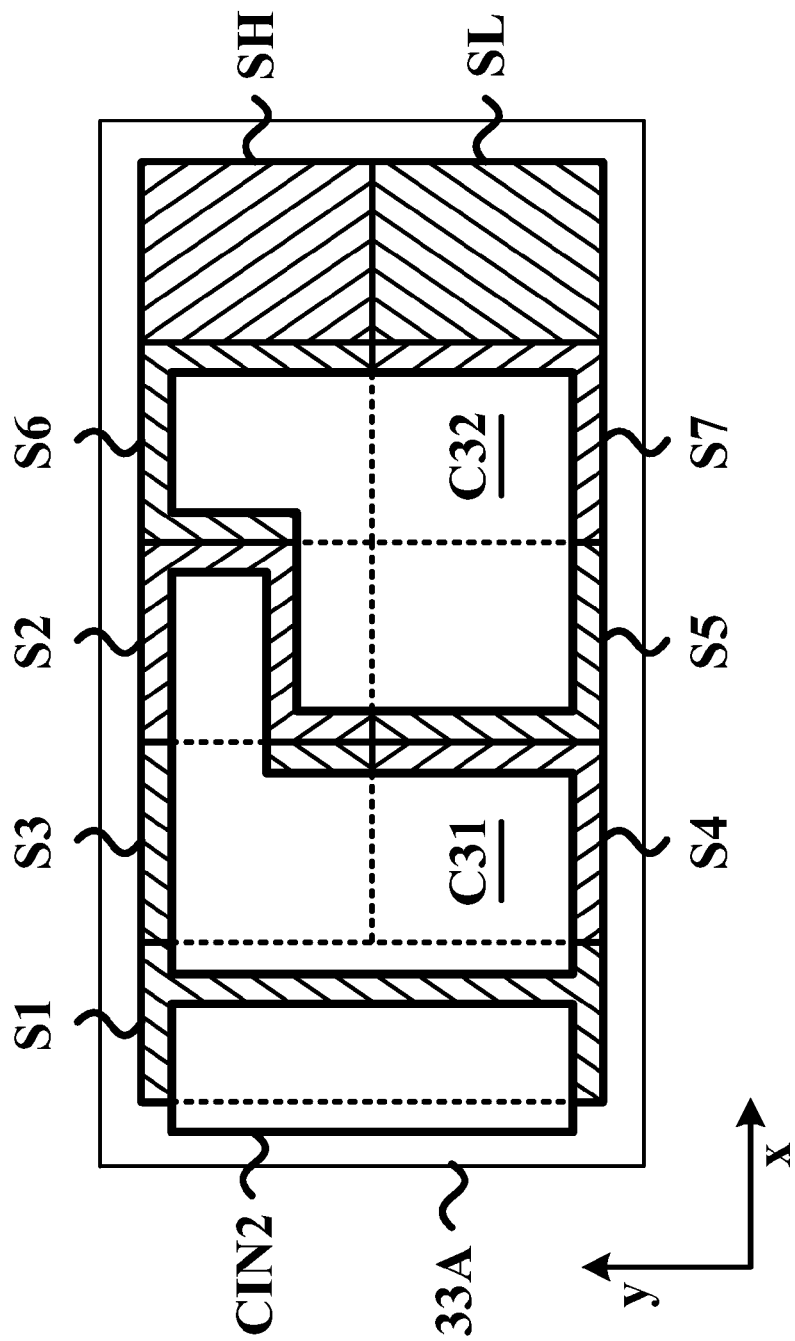
FIG. 3B is a top view of one layout of the power converter whose circuit is shown in FIG. 3A.

A top view of the power converter 30A in FIG. 3B illustrates the disposition of active and passive devices on separate layers coplanar with an xy plane defined by the x and y axes shown and stacked along a z axis perpendicular to the xy plane. The capacitors C31, C32, CIN2 are disposed on a device face of a passive layer over a device face of an active layer, on which are formed active devices S1-S7.

Figure 1C:
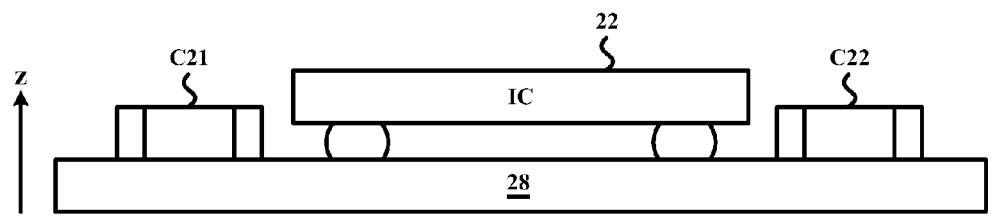
FIG. 1C is a side view of the power converter illustrated in FIG. 1B.
Figure 1D:
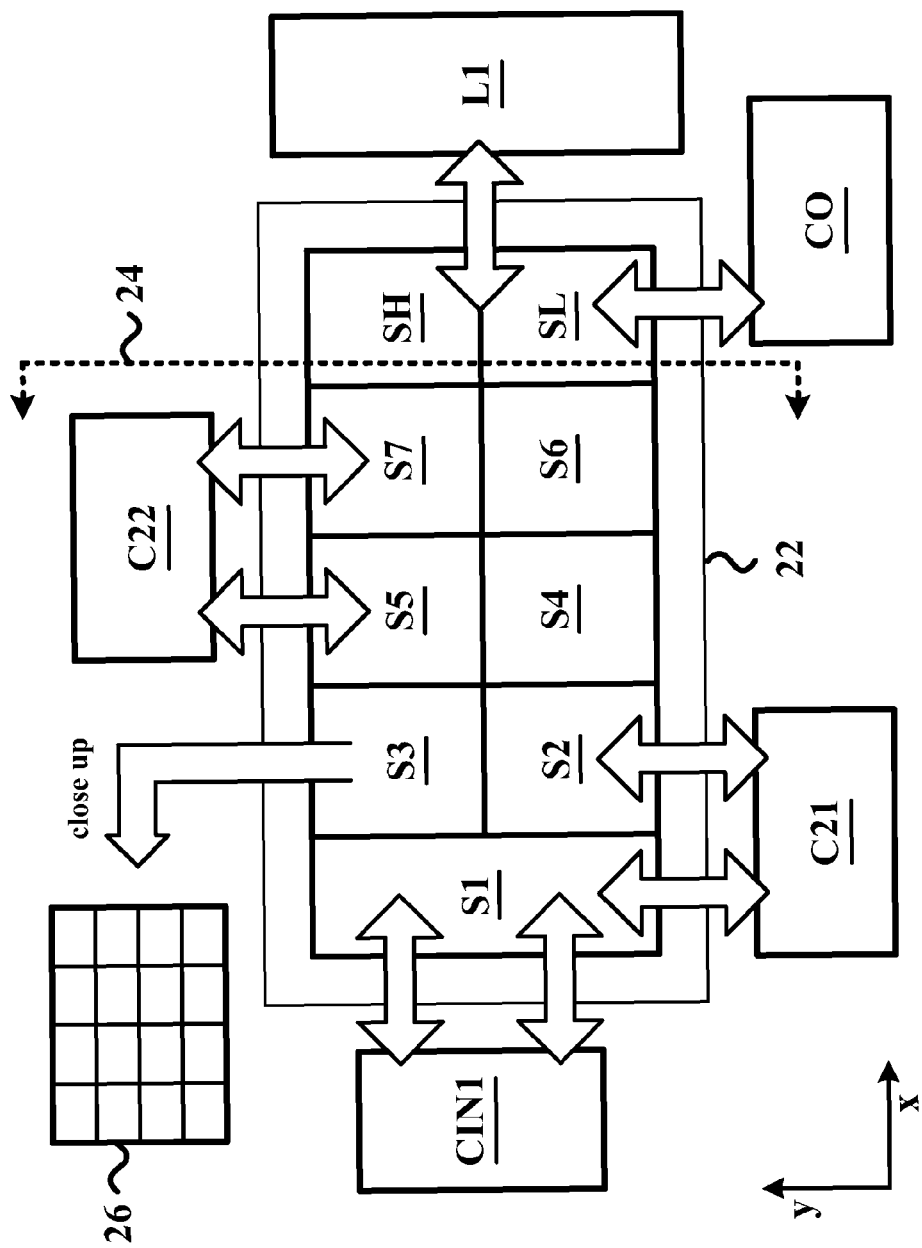
FIG. 1D is a top view of the power converter illustrated in FIG. 1B.

Each capacitor is arranged such that it is directly above the particular active device to which it is to be electrically connected. For example, a first capacitor C31 is directly above switches S1-S4. This is consistent with FIG. 3A, which shows that the positive terminal of the first capacitor C31 is to be connected to first and second switches S1, S2 while the negative terminal of the first capacitor C31 is to be connected to third and fourth switches S3, S4. This arrangement shortens the distance current needs to flow between the active devices and the passive devices in comparison to the arrangement illustrated in FIG. 1B-1D, thereby reducing the energy loss.

FIG. 3B shows another power converter 30B, often referred to as a four-level flying capacitor buck converter. It is a particular implementation of a multi-level buck converter. Other examples include three-level fly capacitor buck converters and five-level capacitor buck converters. Such power converters incorporate a switched-capacitor circuit and can readily be implemented using stacked layers as illustrated in FIGS. 2A-2C.

If the power converter 30B is implemented using the embodiment illustrated in FIG. 2A, then the device stack 33B includes a top active layer 42A and a bottom passive layer 41A. The active devices S31-S36 are included in the active layer 42A, while the fly capacitors C3A-C3B are included in the passive layer 41A. The fly capacitors C3A-C3B are vertically disposed below the active devices S31-S36 to reduce the energy loss in the electrical interconnection.

In operation, the input voltage VIN is chopped using the active devices S31-S36 and the two fly capacitors C3A-C3B. This results in a pulsating voltage at an output node LX. This pulsating voltage is presented to an LC filter represented by a filter inductor L31 and a load capacitor CO, thereby producing an output voltage VO, which is the average of the voltage at the LX node.

Figure 4:
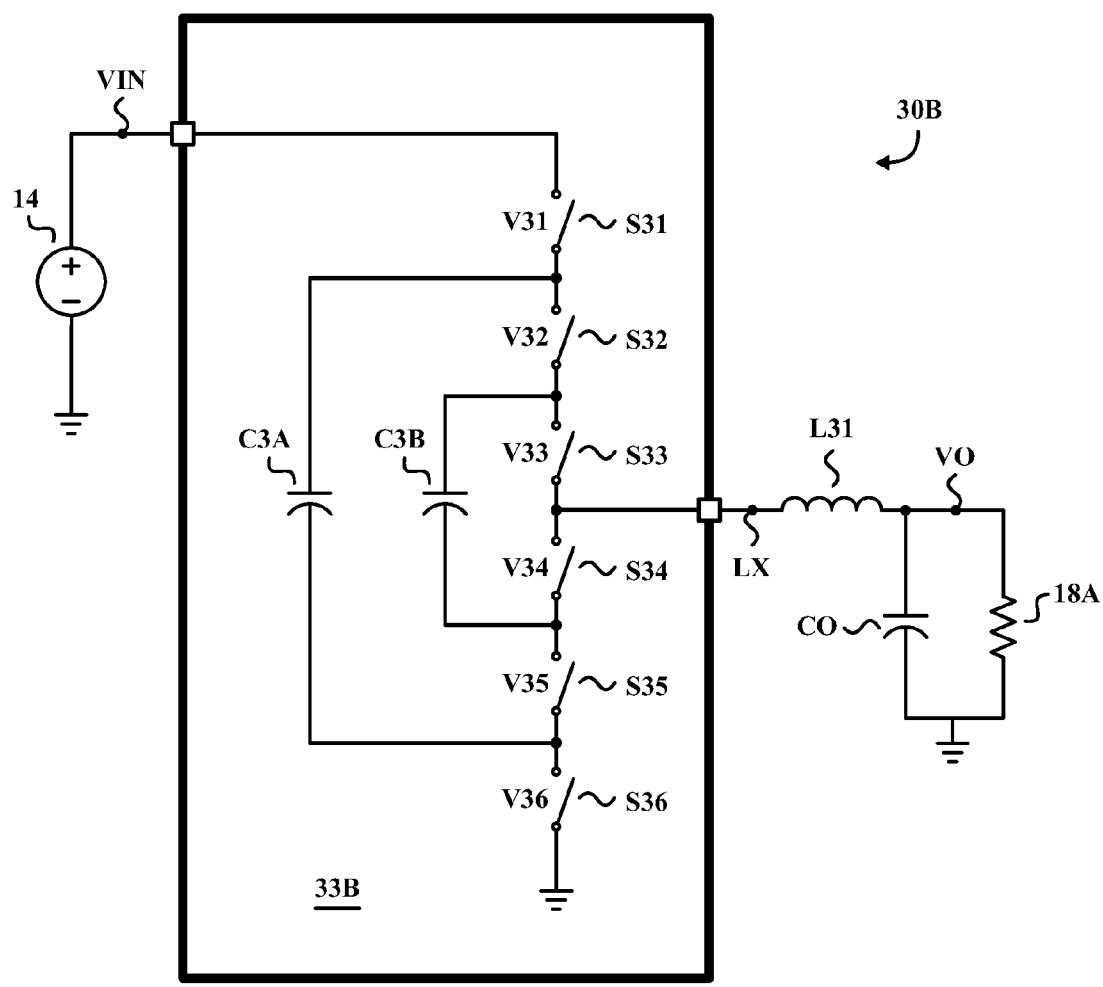
FIG. 4 is a circuit diagram of a four-level buck converter with integrated capacitors.

In the remaining description of FIG. 4, the power converter 30B is assumed to be connected to a 12 volt source 14 and to provide 4 volts to the load 18A. The power converter 30B is in one of eight different states. Depending upon the state, the voltage at the output node LX is 12 volts, 8 volts, 4 volts or 0 volts, assuming that the first fly capacitor C3A is charged to 8 volts and that the second fly capacitor C3B is charged to 4 volts.

The power converter 30B alternates between combinations of the states depending upon the desired output voltage VO. Additionally, the duration of time the power converter 30B is in each state enables regulation of the output voltage VO. It is important to note that the power converter 30B always operates such that the fly capacitors C3A-C3B are charged as much as they are discharged. This maintains a constant average voltage across the fly capacitors C3A-C3B.

Figure 5:
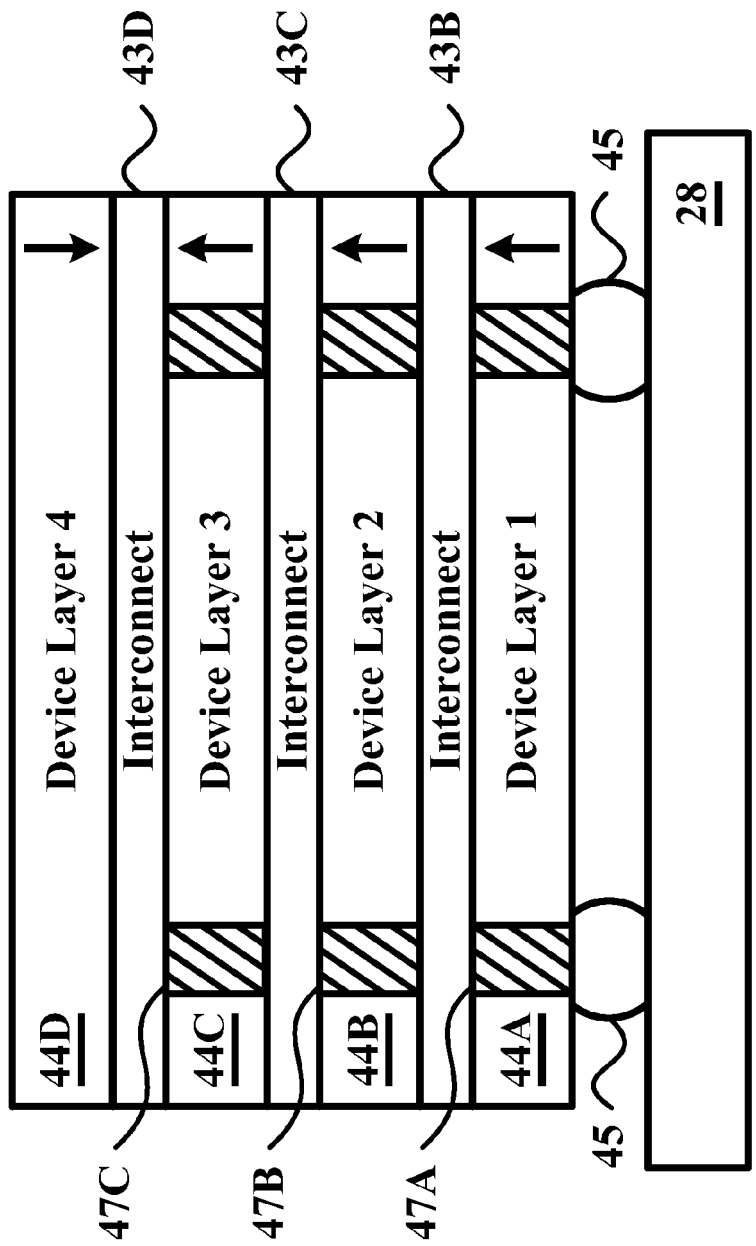
FIG. 5 is a side view of a power converter with generic device layers.

A generalization of the embodiments illustrated in FIGS. 2A-2C is illustrated in FIG. 5, which includes four device layers 44A-44D. In general, at least two device layers are required, one of which includes active devices and the other of which includes passive devices. Typically, the pitch of the interconnect structure 43A-43D is finer than the pitch of the bumps 45, such as solder balls, gold studs, and copper pillars, that couple the power converter to the electrical interface 28. The individual capacitors in the layer with passive devices are sized and arranged so as to fit above or below one or more active devices. Furthermore, the switched capacitor elements are also partitioned and laid out in a specific way to reduce parasitic energy loss in the interconnect structures.

Since semiconductor processing is sequential, it is common to only process one side of a wafer. This adds one more dimension to the number of possible permutations. Assuming there is one active layer 42A, one passive layer 41A, one device face per layer, and thru vias 47A, there are a total of eight different ways of arranging the two layers.

FIGS. 6A-6C and FIG. 2A illustrate the four possible combinations in which the passive layer 41A is on top and the active layer 42A is on the bottom. As used herein, a "bottom" layer is the layer closest to the electrical interface and the "top" layer is the layer furthest from the electrical interface.

Figure 6A:
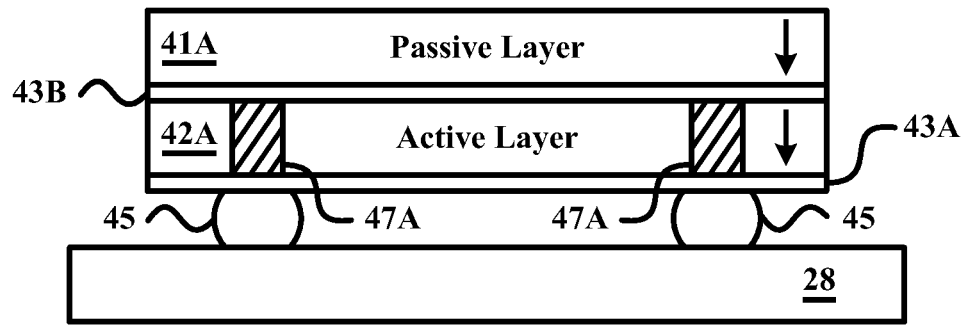
FIGS. 6A-6C are three side views of a power converter in which an active device layer is between a passive device layer and an electrical interface.

In FIG. 6A, the interconnect structure 43A electrically connects the active devices in layer 42A to thru vias 47A and bumps 45. Similarly, the interconnect structure 43B electrically connects the passive devices in layer 41A to thru vias 47A. As indicated by the arrows, the device faces of the passive and active layers 41A, 42A face away from each other.

Figure 6B:
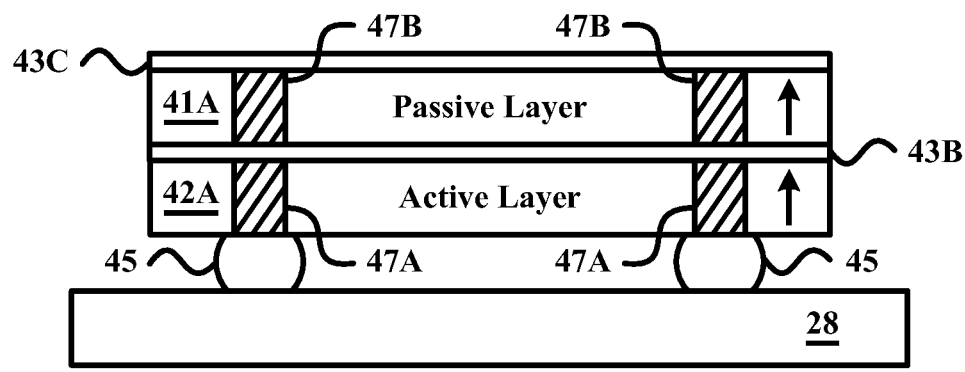

In FIG. 6B, the interconnect structure 43B electrically connects the active devices in layer 42A to thru vias 47A and thru vias 47B. Similarly, the interconnect structure 43C electrically connects the passive devices in layer 41A to thru vias 47B. As indicated by the arrows, the device faces of the passive and active layers 41A, 42A face away from each other.

Figure 6C:
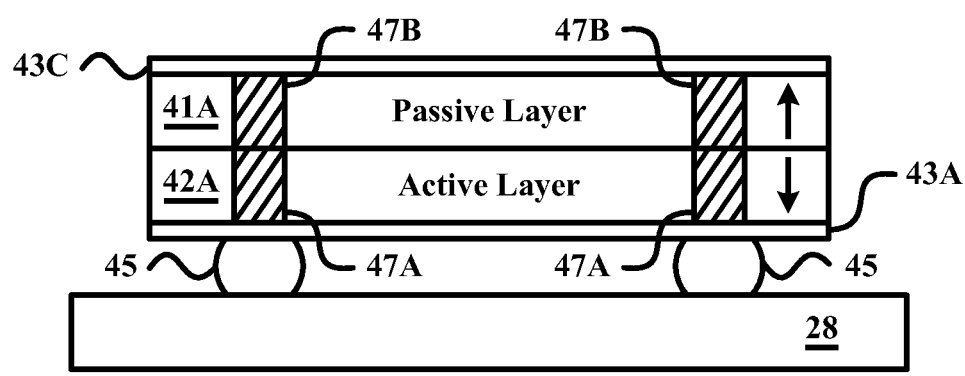

Lastly, in FIG. 6C, the interconnect structure 43A electrically connects the active devices in 42A to thru vias 47A and bumps 45. Similarly, the interconnect structure 43C electrically connects the passive devices in layer 41A to thru vias 47B. As indicated by the arrows, the device faces of the passive and active layers 41A, 42A, face away from each other.

In comparison, FIGS. 6D-6F and FIG. 2B illustrate the four possible combinations in which the active layer 42A is on top and the passive layer 41A is on the bottom.

Figure 6D:
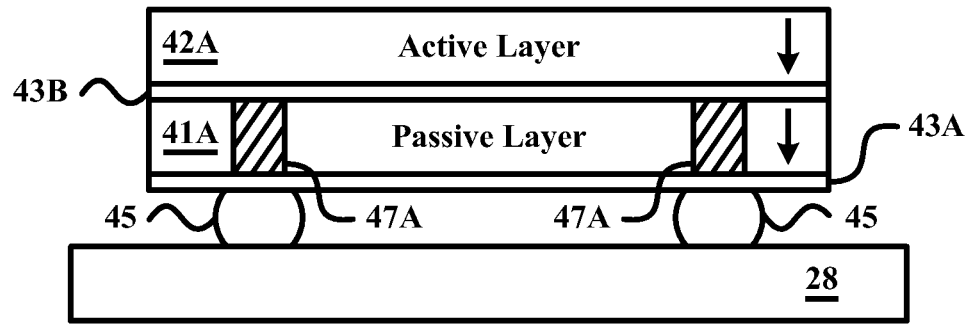
FIGS. 6D-6F are three side views of a power converter in which a passive device layer is between an active layer and the electrical interface.
Figure 6E:
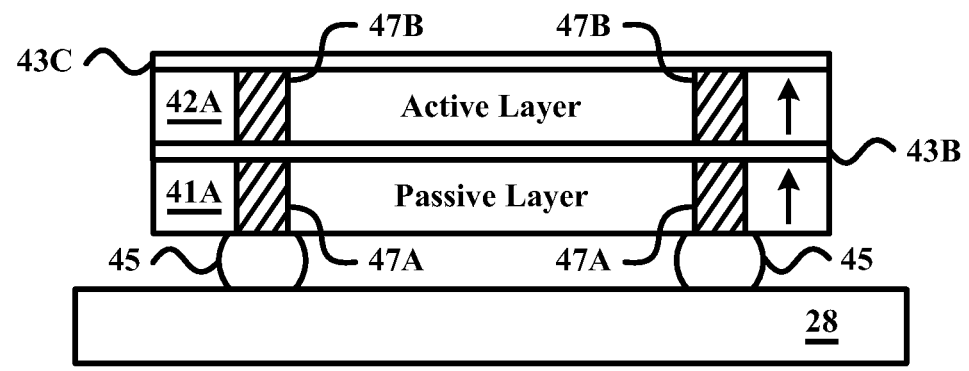
Figure 6F:
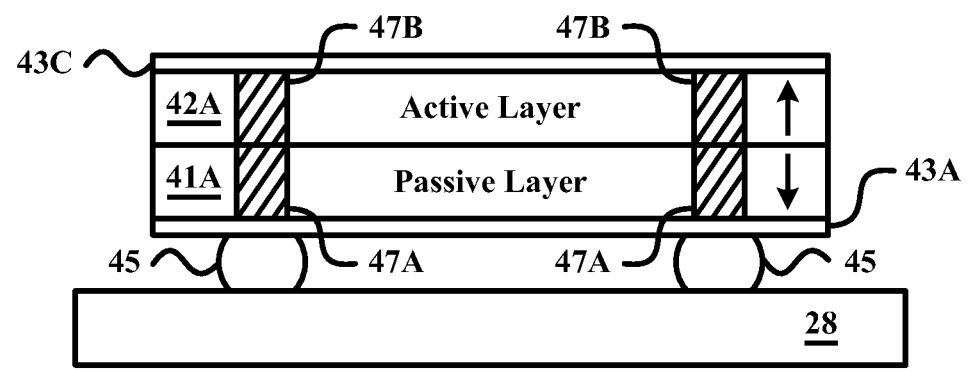

In FIGS. 6D-6F, the active layer 42A and the passive layer 41A are electrically connected together as described in connection with FIGS. 6A-6C. The choice of configuration depends upon numerous factors, most of which relate to thru via technology and to the number of pins to the outside world. For example, if there are a larger number of electrical connections between the passive layer 41A and active layer 42A than to the outside world than the configurations illustrated in FIG. 2A & FIG. 2B are more desirable. However, if the opposite is true than the configurations illustrated in FIG. 6A and FIG. 6D are more desirable.

Figure 7A:
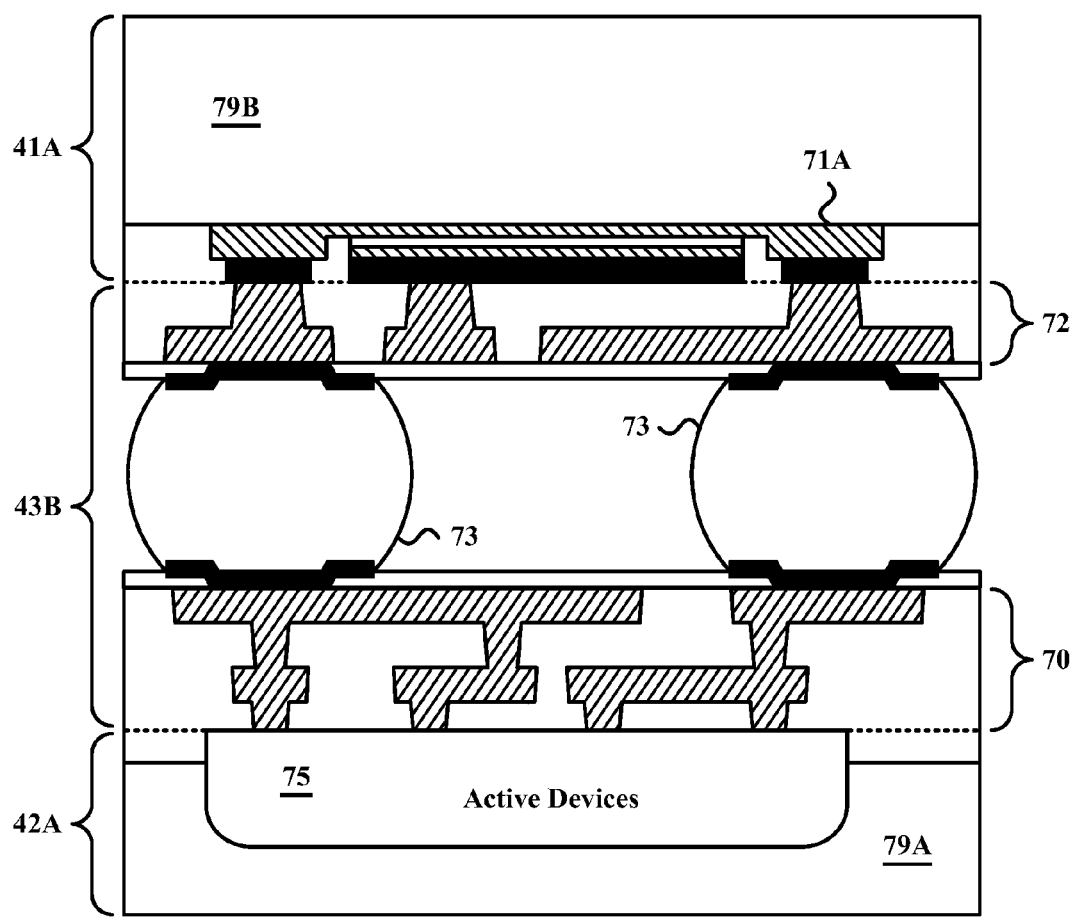
FIG. 7A is a side view of a power converter with a planar capacitor.
Figure 7B:
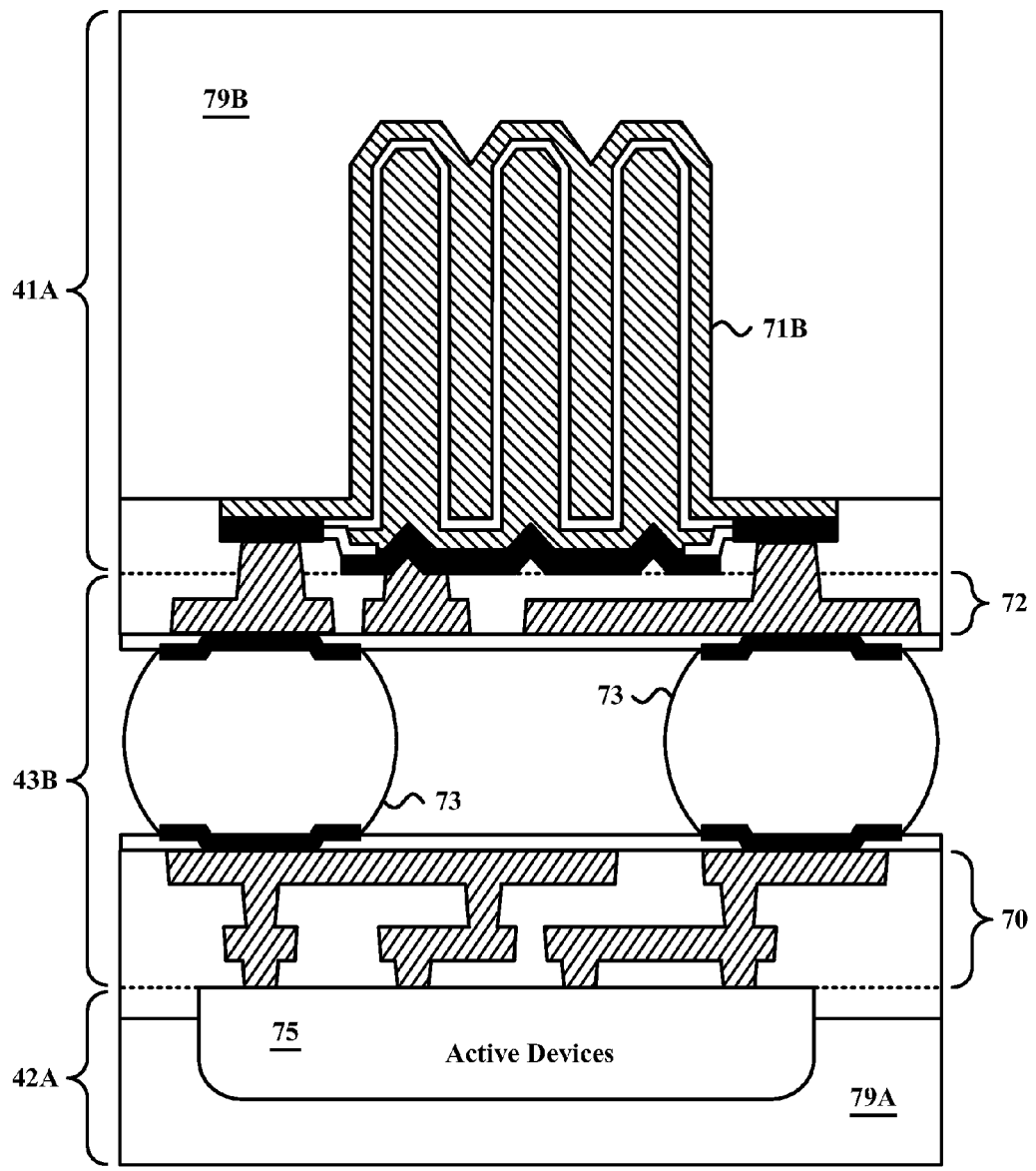
FIG. 7B is a side view of a power converter with a trench capacitor.

The passive substrate and active substrate can be in any form when attached, such as singulated dice or full wafers. Two different implementations that are amenable to die-to-die attachment are shown in FIGS. 7A-7B. Each implementation includes a different type of capacitor.

The capacitors can be of any structure. However, trench capacitors have a capacitance per unit area that is one to two orders of magnitude higher than that of an equivalent planar capacitor, and also have lower equivalent series resistance than equivalent planar capacitors. Both of these capacitor attributes are desirable for use in power converters that use capacitive energy transfer because they favorably affect the efficiency of the power converter.

In the embodiment shown in FIG. 7A, the passive layer 41A includes a planar capacitor 71A and the active layer 42A includes active devices 75. In contrast, the embodiment shown in FIG. 7B, includes a trench capacitor 71B in its passive layer 41A.

The interconnect structure 43B electrically connects the devices within the passive layer 41A to the devices within the active layer 42A. The interconnect structure 43B can be implemented in numerous ways, one of which are illustrated in FIGS. 7A and 7B.

In the case of FIGS. 7A-7B, the interconnect structure 43B is composed of a multilayer interconnect structure 72 on the passive substrate, a single layer of solder bumps 73, and a multilayer interconnect structure 70 on the active substrate.

The bumps 45 are not visible in FIGS. 7A-7B because their pitch on the electrical interface 28 is typically much larger than the interconnect structure 43B. However, to connect to the outside world, some form of connection, such as bumps 45 along with thru vias 47A, is useful.

The bumps 45 can either be located above the passive layer 41A or below the active layer 42A. In the case in which the bumps 45 are located above the passive layer 41A, the thru vias cut 47A through the passive layer 41A as illustrated in FIG. 2B. In the case in which the bumps 45 are located below the active layer 42A, the thru vias 47A cut through the active layer 42A as illustrated in FIG. 2A.

Figure 8A:
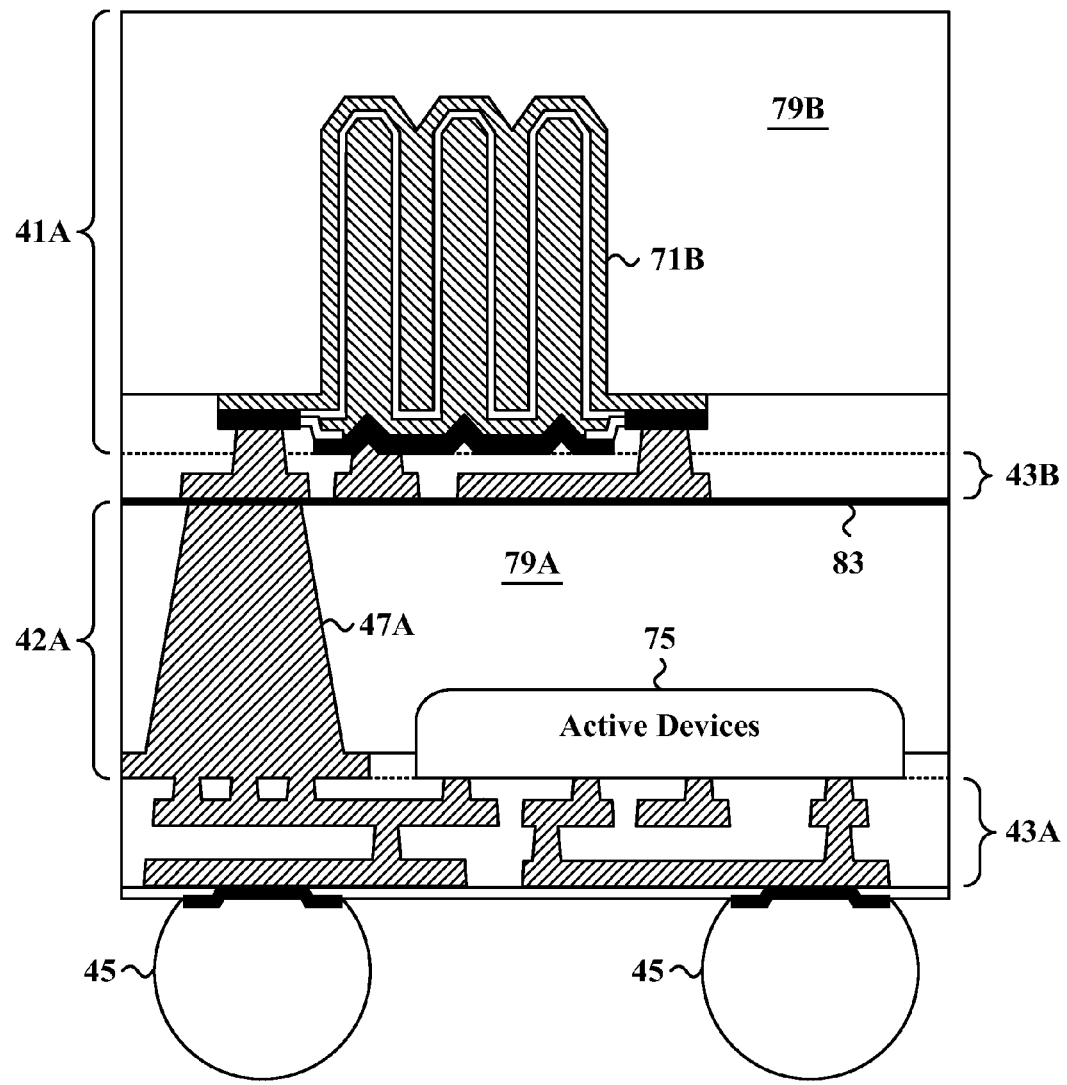
FIG. 8A is a particular implementation of the power converter shown in FIG. 6B.
Figure 8B:
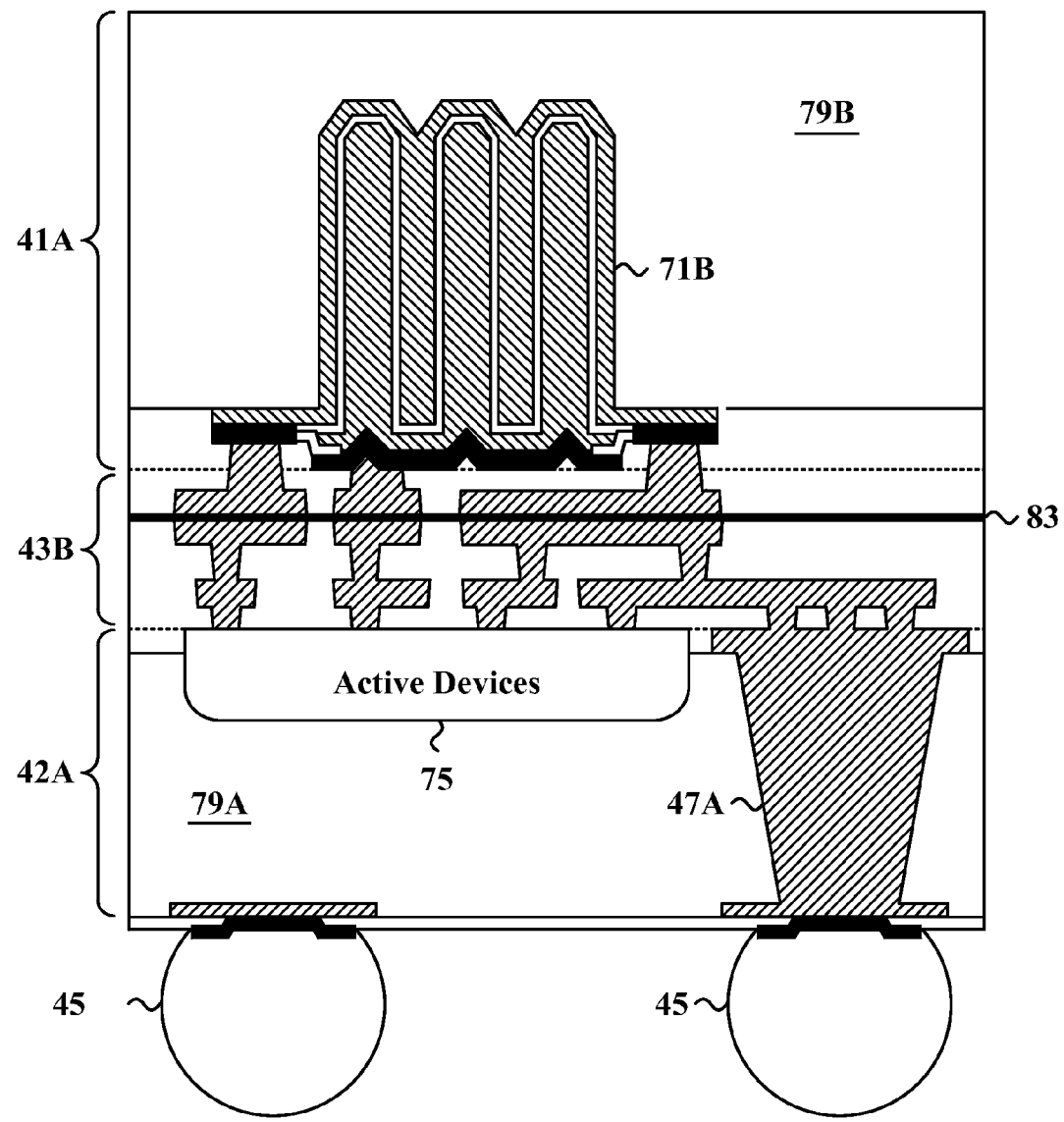
FIG. 8B is a particular implementation of the power converter shown in FIG. 6A.

Embodiments of this invention can also be implemented with wafer-to-wafer stacking as shown in FIGS. 8A-8B. The embodiment illustrated in FIG. 8A is a particular implementation of FIG. 6B, whereas, the embodiment illustrated in FIG. 8B is a particular implementation of FIG. 6A.

The two wafers are electrically connected together using a bonding layer 83 instead of using solder bumps 73 as in the case of FIGS. 7A-7B. There are numerous types of wafer-to-wafer bonding process. Among these are copper-copper bonding, oxide-oxide bonding, and adhesive bonding. Furthermore, FIGS. 8A-8B illustrate the thru vias 47A and their respective bumps 45, which were absent in FIGS. 7A-7B.

Power converters that rely on capacitors to transfer energy generally have complex networks with many switches and capacitors. The sheer number of these components and the complexity of the resulting network make it difficult to create efficient electrical interconnections between switches and capacitors.

Typically, metal layers on an integrated circuit or on integrated passive device are quite thin. Because thin metal layers generally offer higher resistance, it is desirable to prevent lateral current flow. This can be accomplished by controlling the electrical paths used for current flow through the power converter. To further reduce energy loss resulting from having to traverse these electrical paths, it is desirable to minimize the distance the current has to travel. If properly done, significant reductions energy loss in the interconnect structure can be realized. This is accomplished using two techniques.

One way to apply the foregoing techniques to reduce interconnection losses is to partition the switched capacitor element 12A into switched capacitor units operated in parallel, but not electrically connected in parallel. Another way is to choose the shape and location of the switches on the die to fit optimally beneath the capacitors and vice versa.

Figure 9B:
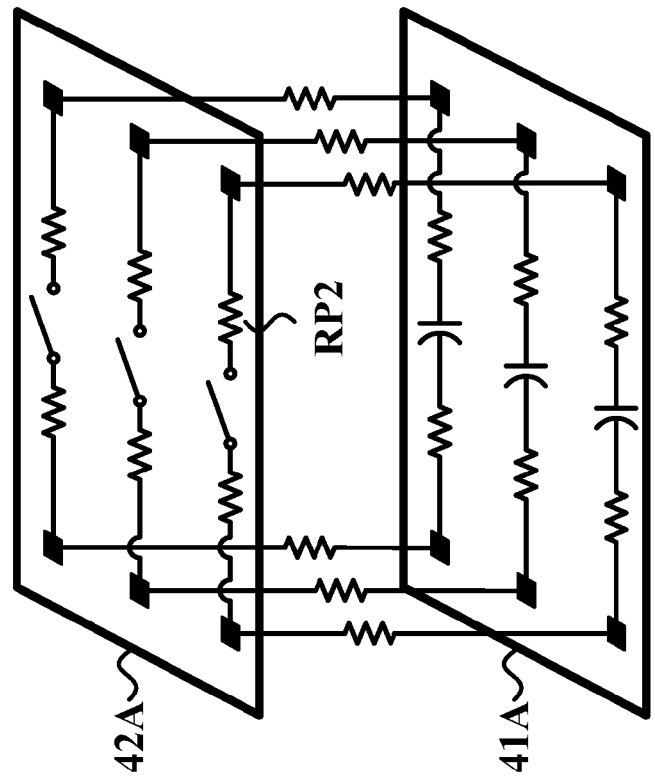
FIG. 9B shows a parasitic network between the active and passive layer with three nodes.
Figure 9A:
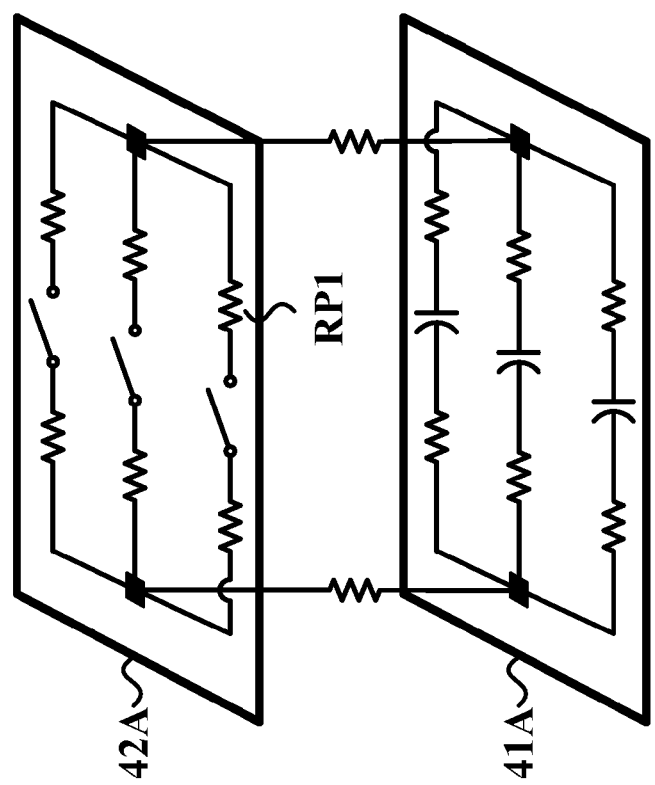
FIG. 9A shows a parasitic network between the active and passive layer with one node.

Partitioning the SC element 12A is effective because it reduces the horizontal current flow that has always been seen as inevitable when routing physically large switches and capacitors to a single connection point or node as depicted in FIG. 9A.

As is apparent from FIG. 9A, current in a physically large component will tend to spread out across the component. To the extent it spreads in the lateral direction, its path through the material becomes longer. This is shown in FIG. 9A by noting the difference between the path length between the two nodes through the center switch and the path length between the two nodes through the lateral switches. This additional path length results in loss, represented in the equivalent circuit by RP1.

By partitioning the component into smaller sections, one can equalize the path length differences between the two nodes, thus reducing associated losses. For example, if the switch and the capacitor in FIG. 9A are partitioned into three sections, the equivalent circuit is approximately that shown in FIG. 9B, in which the lumped resistances associated with the path between nodes is represented by a smaller lumped resistance RP2.

FIGS. 10A-10D illustrate the application of both of these techniques to the implementation of a power converter.

Figure 10A:
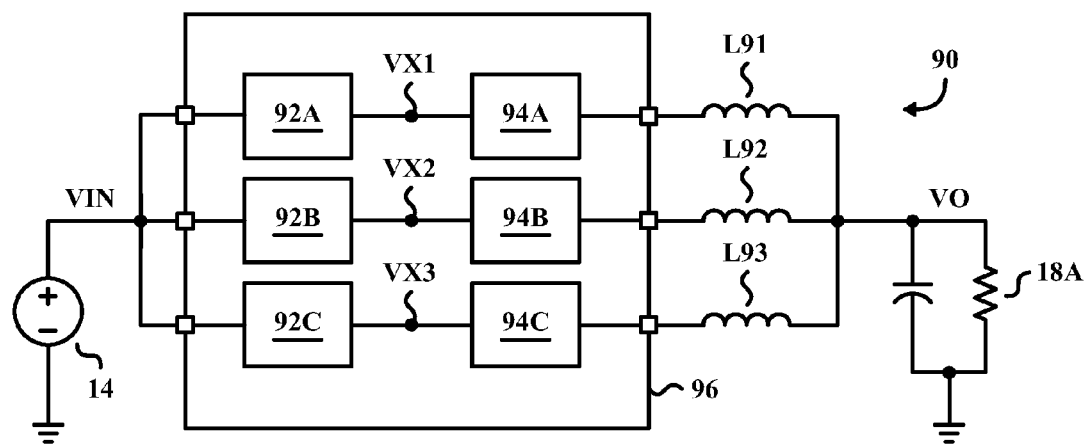
FIG. 10A is a block diagram of a partitioned power converter.

As shown in FIG. 10A, the regulating and switching components of a power converter 90 are partitioned to encourage a more direct electrical path between them, and to minimize any lateral current flow. In the particular example of FIG. 10A, the power converter 90 includes a switched capacitor unit 92A connected to a regulating circuit unit 94A at a first node VX1, a switched capacitor unit 92B connected to regulating circuit unit 94B at a second node VX2, and a switched capacitor unit 92C and regulating circuit unit 94C connected at a third node VX3. Furthermore, first inductor L91, second inductor L92, and third inductor L93 are located at the output of each regulating circuit units 94A-94C. These inductors L91-L93 are then shorted together at the load.

Figure 11:
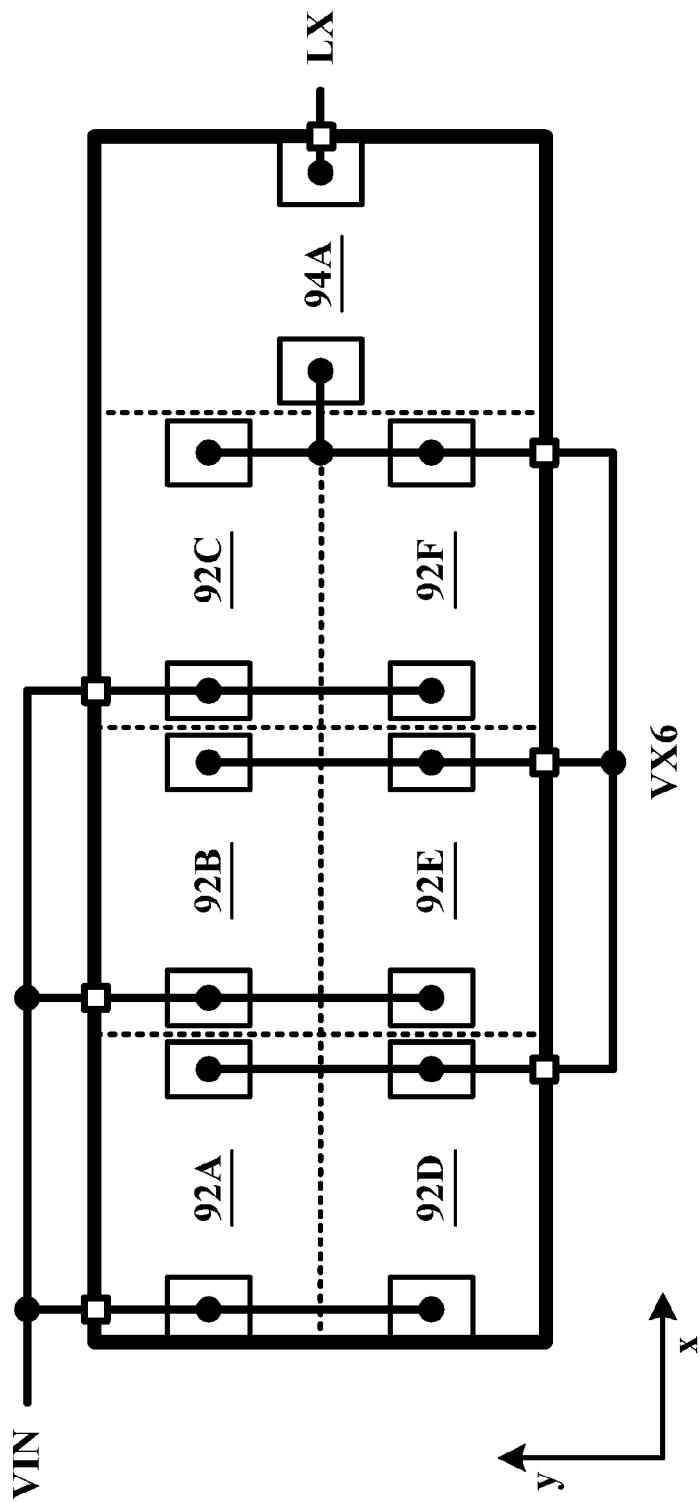
FIG. 11 is a top view of an alternative implementation of the partitioned power converter shown in FIG. 10A.

Although FIG. 10A shows both the regulating circuit 16A and the switching capacitor element 12A as both being partitioned, this is not necessary. It is permissible to partition one and not the other. For example, in the embodiment shown in FIG. 11, only the switching capacitor element 12A has been partitioned. A corollary that is apparent from the embodiment shown in FIG. 11 is that the number of partitions of regulating circuit 16A and the number of partitions of the switched capacitor element 12A need not be the same, as is the case in the particular example shown in FIG. 10A.

Figure 10B:
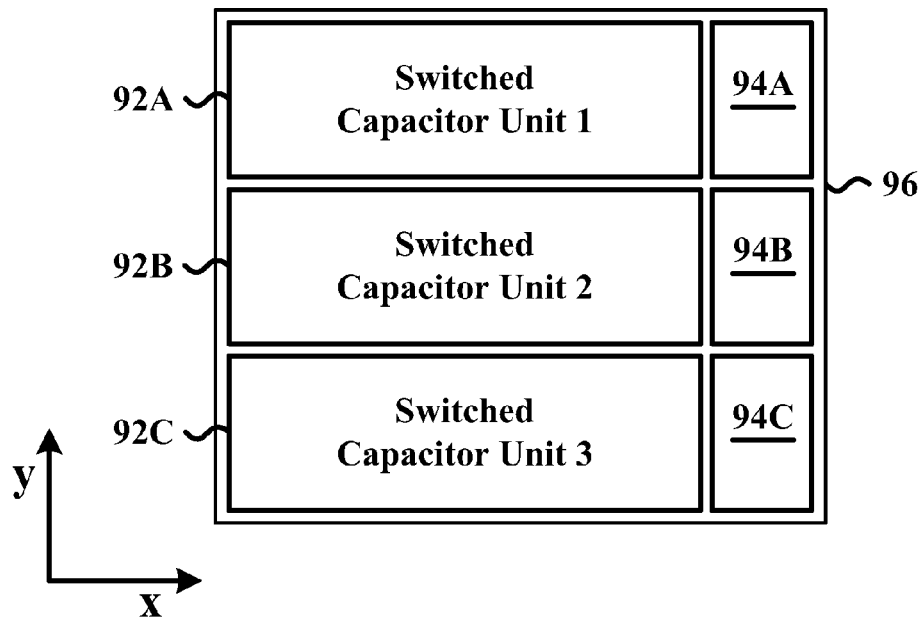
FIG. 10B is a top view of a particular implementation of the partitioned power converter shown in FIG. 10A.

A top view of the power converter 90 shown in FIG. 10A is illustrated in FIG. 10B. The switched capacitor units 92A-92C extend along the y direction, where the first switched capacitor unit 92A is at the top, the second switched capacitor unit 92B is in the middle, and the third switched capacitor unit 92C is at the bottom. The regulating circuit units 94A-94C extend along they direction as well.

Like the power converter 30A shown in FIGS. 3A-3B, the device stack 96 includes a top passive layer 41A and a bottom active layer 42A. The capacitors within the switched capacitor units 92A-92C are included in the passive layer 41A, whereas the active devices within the switched capacitor units 92A-92C and regulating circuit units 94A-94C are include in the active layer 42A.

Figure 10C:
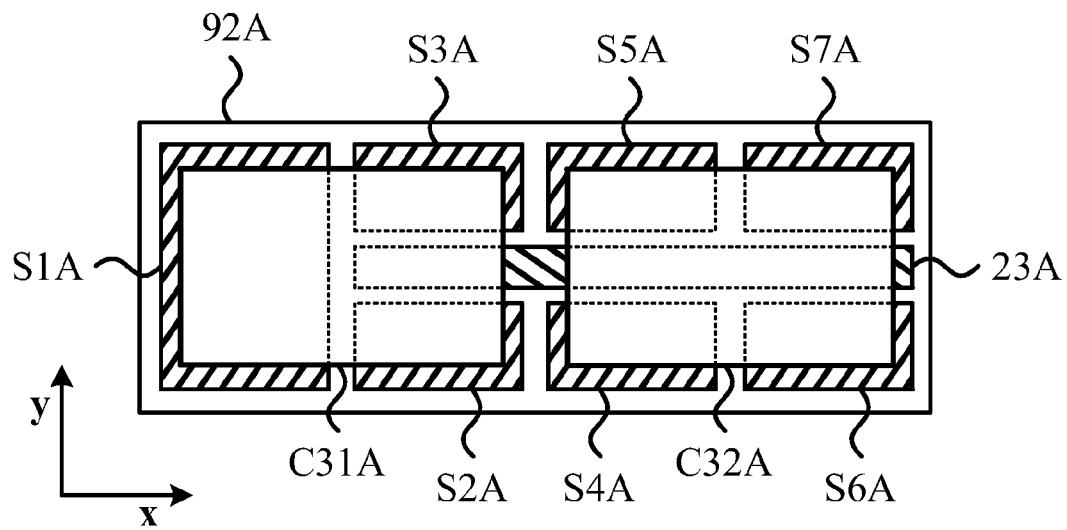
FIG. 10C is a close up of a switched capacitor unit from the partitioned power converter implementation illustrated in FIG. 10B.

As shown in the top view of FIG. 10C, switched capacitor unit 92A includes seven power switches S1A-S7A, two pump capacitors C31A-C31B, and a control/driver circuit 23A. The exact size of the active devices need not be the same size as the passive elements for the first loss-reduction technique to be effective. They simply need to be underneath the passive devices. This arrangement allows for more uniform current distribution and reduced wire length in the interconnect structure of the power converter.

Figure 10D:
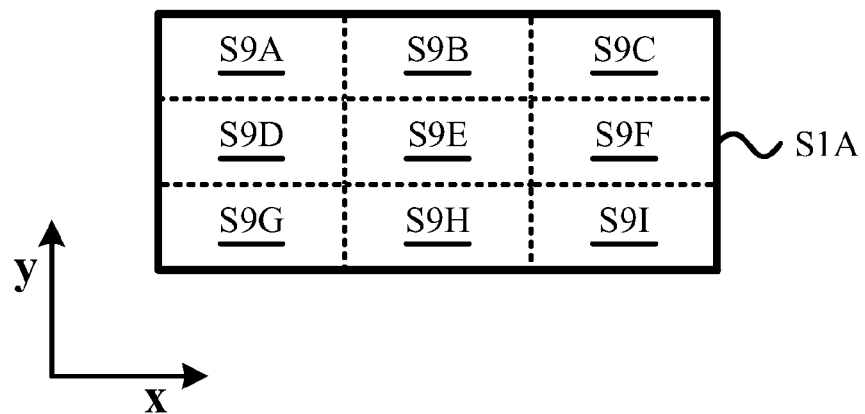
FIG. 10D is a close up of one switch from the switched capacitor unit illustrated in FIG. 10C.

Furthermore, within each switched capacitor unit 92A-92C, the power switches and pump capacitors can be divided up into smaller subunits. This allows for an additional reduction in lateral current flow. An example of the power switch S1A divided up into nine sub units S9A-S9I is illustrated in FIG. 10D.

Since the single monolithic switched capacitor element 12A is divided up into numerous smaller switched capacitor units 92A-92C and placed so as to encourage current in only one direction as shown in FIG. 10B, the equivalent circuit becomes like that in FIG. 9B, thus reducing overall losses.

The technique is effective because the total capacitance increases when capacitors are placed in parallel. For example, this technique is far less effective with inductors because total inductance decreases when inductors are placed in parallel.

Another possible arrangement of the switched capacitor cells is shown in FIG. 11, in which the switched capacitor element is partitioned into small switched capacitor units 92A-92F along both the x and y direction. The exact size and dimensions of the switched capacitor units 92A-92F depend upon many characteristics such as metal thickness, capacitance density, step-down ratio, etc. Both of these techniques reduce the vertical and lateral distance between the switch devices and the passive devices while also providing a uniform current distribution to each individual switch and/or switched capacitor cell. Thus, the parasitic resistance and inductance of the connection between the switches and capacitors is minimized. This is important because the parasitic inductance limits the speed at which the converter can operate and hence its ultimate size while the parasitic resistance limits the efficiency of the power conversion process.

Among other advantages, the arrangements described above avoids the component and pin count penalty, reduces the energy loss in the parasitic interconnect structures and reduces the total solution footprint of power converters that use capacitors to transfer energy.

An apparatus as described herein finds numerous applications in the field of consumer electronics, particularly smart phones, tablet computers, and portable computers. In each of these cases, there are displays, including touch screen displays, as well as data processing elements and/or radio transceivers that consume power provided by the apparatus described herein.

Having described the invention, and a preferred embodiment thereof, what I claim as new, and secured by Letters Patent is:

1. An apparatus comprising a power converter circuit comprising a stack of layers, said stack comprising a first layer having active devices integrated on a device face thereof and a second layer having passive devices integrated on a device face, thereof, wherein at least one unit selected from the group consisting of said active devices and said passive devices is partitioned into at least a first partition and a second partition, wherein said first partition comprises a first current channel along a first axis, wherein said second partition comprises a second current channel, and wherein said first axis and a second axis orthogonal to said first axis define a plane that is coplanar with the layer that includes said unit, whereby, as a result of said at least one unit having been partitioned into at least said first and second partitions, current flow between said first and second current channels along said second axis is suppressed.

2. The apparatus of claim 1, wherein said passive devices comprise a planar capacitor.

3. The apparatus of claim 1, further comprising a regulating circuit in electrical communication with said stack of layers, wherein said regulating circuit comprises a first regulating-circuit partition, a second regulating-circuit partition, a first inductor, and a second inductor, wherein said first inductor comprises a first terminal and a second terminal, wherein said first terminal of said first inductor is connected to an output of said first regulating-circuit partition, and wherein said second terminal of said first inductor is connected to a load, wherein said second inductor comprises a first terminal and a second terminal, wherein said first terminal of said second inductor is connected to an output of said second regulating-circuit partition, and wherein said second terminal of said second inductor is connected to said second terminal of said first inductor, whereby in operation, said second terminal of said first inductor and said second terminal of said second inductor are at a common potential.

4. The apparatus of claim 3, further comprising a load connected to said second terminal of said first inductor and said second terminal of said second inductor.

5. The apparatus of 4, wherein a first switched capacitor unit is positioned over said first regulating-circuit partition at a location that minimizes an extent to which current travels between said power converter circuit and said first regulating-circuit partition.

6. The apparatus of claim 1, further comprising a first terminal, a second terminal, a third terminal, and a fourth terminal, wherein said first current channel extends between said first terminal and said second terminal, and wherein said second current channel extends between said third terminal and said fourth terminal.

7. The apparatus of claim 6, wherein said first current channel enables electric current to flow directly between said first terminal and second terminal, and wherein said electric current bypasses said second current channel.

8. The apparatus of claim 6, wherein said second current channel enables electric current to flow directly between said third terminal and said fourth terminal, and wherein said electric current bypasses said first current channel.

9. The apparatus of claim 1, wherein said second current channel extends along a third axis, wherein said third axis extends along a direction having a component that is parallel to said first axis.

10. The apparatus of claim 1, wherein said second current channel extends along a third axis, wherein said third axis is parallel to said first axis.

11. An apparatus comprising a power converter circuit comprising a stack of layers, each of which includes devices that are integrated into one of a single monolithic substrate and multiple monolithic substrates, said stack of layers comprising first and second layers having corresponding first and second device faces on which devices are formed, wherein said first layer comprises an active device and said second layer comprises a passive device, wherein a unit selected from one of said first layer and said second layer comprises first and second partitions that cause current to flow along corresponding first and second directions that extend along a layer that includes said unit, and wherein said first direction extends along a first axis that, together with a second axis that is orthogonal to said first axis, defines a plane that is coplanar with said one of said first layer and said second layer.

12. The apparatus of claim 11, further comprising an interconnection, wherein said interconnection is disposed between said first layer and said second layer.

13. The apparatus of claim 12, further comprising solder bumps, wherein said interconnection is in contact with said solder bumps.

14. The apparatus of claim 11, wherein said power converter circuit further comprises a via extending through at least one of said first layer and second layer.

15. The apparatus of claim 11, wherein said first layer and said second layer are wafer bonded at said device faces thereof.

16. The apparatus of claim 11, further comprising a data processing unit and a display unit, both of which are configured to consume power provided by said power converter circuit.

17. The apparatus of claim 11, further comprising a data processing unit, a touch-screen interface, and a wireless transmitter and receiver, all of which are configured to consume power provided by said power converter circuit.

18. The apparatus of claim 11, further comprising a driver and control unit to provide power and to control said active devices.

19. The apparatus of claim 11, wherein said power converter circuit comprises a switch-mode power converter, wherein said switch-mode power converter is configured to regulate at least one of an output voltage and an output current by causing an energy storage element to be switched into different electrical configurations.

20. The apparatus of claim 11, wherein said power converter circuit comprises a multi-level power converter, wherein said multi-level power converter comprises an inductor and a fly capacitor, wherein said active device is one of a plurality of active devices that cooperate to connect said inductor and said fly capacitor into different electrical configurations.

21. The apparatus of claim 11, wherein said power converter circuit comprises a switched capacitor circuit, said switched capacitor circuit comprising a plurality of capacitors for use in energy transfer, and wherein said active device is one of a plurality of active devices that interconnect said capacitors and that cause said capacitors to transition between different configurations of capacitors.

22. The apparatus of claim 11, wherein said active device comprises a transistor.

23. The apparatus of claim 11, wherein said passive device comprises a trench capacitor.

24. The apparatus of claim 11, wherein said first and second partitions are configured such that current flow along said second axis is lower than what said current flow along said second axis would have been had said unit consisted of only said first partition.

25. The apparatus of claim 11, wherein said second direction has a component that is parallel to said first direction.

26. The apparatus of claim 11, further comprising a multi-layer ceramic discrete capacitor.

27. An apparatus comprising a circuit, said circuit comprising a switched-capacitor circuit and a regulating circuit connected to said switched-capacitor circuit, said circuit comprising a partitioned unit, devices, and layers with said devices integrated therein, said layers defining a stack of layers, said stack of layers comprising a first layer having an active device integrated therein and a second layer having a passive device integrated therein, wherein said partitioned unit comprises a device integrated into one of said first and second layers, wherein said partitioned unit comprises terminals and partitions, each of which connects to corresponding terminals thereof.

28. The apparatus of claim 27, wherein said partitioned unit comprises a partitioned device.

29. The apparatus of claim 28, wherein said partitioned device comprises a partitioned passive device.

30. The apparatus of claim 29, wherein partitioned passive device comprises a capacitor.

31. The apparatus of claim 28, wherein said partitioned device comprises a partitioned active device.

32. The apparatus of claim 31, wherein said partitioned active device comprises a switch.

33. The apparatus of claim 27, wherein said partitioned unit comprises a partitioned switched-capacitor network.

* * * * *